(12) United States Patent
Jang et al.

(10) Patent No.: US 7,339,188 B1
(45) Date of Patent: Mar. 4, 2008

(54) POLYCRYSTALLINE SILICON FILM CONTAINING NI

(75) Inventors: Jin Jang, Seoul (KR); Seong-Jin Park, Seoul (KR)

(73) Assignee: LG.Philips LCD Co., Ltd., Seoul (KR)

( * ) Notice: Subject to any disclaimer, the term of this patent is extended or adjusted under 35 U.S.C. 154(b) by 0 days.

(21) Appl. No.: 09/497,508

(22) Filed: Feb. 4, 2000

(30) Foreign Application Priority Data

Feb. 10, 1999 (KR) ................................. 1999-4742

(51) Int. Cl.
*H01L 29/04* (2006.01)

(52) U.S. Cl. ........................... 257/49; 257/52; 257/55; 257/63; 257/E33.004

(58) Field of Classification Search ................ 257/52, 257/55, 58, 62, 63; 438/48, 482, 512, 515, 438/517, 526, 539, 554
See application file for complete search history.

(56) References Cited

U.S. PATENT DOCUMENTS 4,940,923 A * 7/1990 Kroontje et al. ............ 315/248
5,612,250 A * 3/1997 Ohtani et al. ............... 437/101
5,932,893 A * 8/1999 Miyanaga et al. ............ 257/66
5,994,164 A * 11/1999 Fonash et al. ............... 438/97
6,365,933 B1 * 4/2002 Yamazaki et al. .......... 257/347

FOREIGN PATENT DOCUMENTS

JP     02052419 A  *  2/1990
JP     02137326 A  *  5/1990

* cited by examiner

*Primary Examiner*—Wai-Sing Louie
(74) *Attorney, Agent, or Firm*—McKenna, Long & Aldridge LLP

(57) ABSTRACT

The present invention is related to a polycrystalline silicon film containing Ni which is formed by crystallizing an amorphous silicon layer containing nickel. The present invention includes a polycrystalline silicon film wherein the polycrystalline film contains Ni atoms of which density ranges from $2\times10^{17}$ to $5\times10^{19}$ atoms/cm$^3$ on average and comprises a plurality of needle-shaped silicon crystallites. In another aspect, the present invention includes a polycrystalline silicon film wherein the polycrystalline film contains Ni atoms of which density ranges from $2\times10^{17}$ to $5\times10^{19}$ atoms/cm$^3$, comprises a plurality of needle-shaped silicon crystallites and is formed on an insulating substrate. Such a polysilicon film according to the present invention avoids metal contamination usually generated in a conventional method of metal induced crystallization.

4 Claims, 17 Drawing Sheets

POLYCRYSTALLINE SILICON FILM CONTAINING NI

BACKGROUND OF THE INVENTION

1. Field of Invention

The present invention is related to a polycrystalline silicon film containing Ni which is formed by crystallizing an amorphous silicon layer containing nickel.

2. Discussion of Related Art

In view of performance, low temperature polysilicon, having low production cost owing to its low formation temperature and which also provides a large-scale display area, is as good as high temperature polysilicon.

There are various methods for forming low temperature polysilicon such as solid phase crystallization (SPC), laser crystallization and the like.

In providing low temperature crystallization under 400° C., as disclosed in Hiroyaki Kuriyama, et al., Jpn. J. Appl. Phys. 31, 4550 (1992), the laser crystallization fails to provide uniform crystallization and has difficulty in forming polysilicon on a substrate of a large area due to the need for an expensive apparatus and low productivity.

When polysilicon is formed by solid phase crystallization, uniform crystallites are attained using an inexpensive apparatus. However, solid phase crystallization requires high temperature and long processing time for crystallization, which is inappropriate for a glass substrate due to high production cost.

A new method of crystallizing amorphous silicon at low temperature, called metal induced crystallization, is disclosed in M. S. Haque, et al., J. Appl. Phys. 79, 7529 (1996). Metal induced crystallization crystallizes amorphous silicon by contacting amorphous silicon with a specific kind of metal which induces crystallization of silicon and then subjecting it to annealing. This allows the lowering of the crystallization temperature.

In Ni-induced crystallization, crystallization is accelerated by the $NiSi_2$ which is the final phase of Ni silicide and works as a crystal nucleus, which is disclosed in C. Hayzelden, et al., J. Appl. Phys. 73, 8279 (1993). As a matter of fact, $NiSi_2$, which has a lattice constant of 5.406 Å, similar to that of silicon which is 5.430 Å, also has a structure similar to silicon. Thus, $NiSi_2$ works as a crystal nucleus of amorphous silicon, accelerating crystallization to the direction <111>, which is disclosed in C. Hayzelden, et al., Appl. Phys. Lett. 60, 225 (1992). The crystallization of amorphous silicon is accelerated by metal species.

Metal-induced crystallization is affected by time and temperature of annealing as well as quantity of metal, of which crystallization time is lowered in general when the quantity of metal increases.

Metal induced crystallization has an advantage of low crystallization temperature, which unfortunately requires long thermal process time of over 20 hours at 500° C. Therefore, this method has many difficulties for mass production of polycrystalline silicon.

As the quantity of metal increases, metal induced crystallization becomes more effective. However, the intrinsic characteristics of a silicon film are changed due to metal contamination in the crystallized silicon film.

As mentioned in the above explanation, despite the advantage of low temperature crystallization, metal-induced crystallization has a fatal defect in that the intrinsic characteristics of a silicon film are changed due to metal contamination from the metal used for crystallization which remains in the crystallized silicon film.

Accordingly, the quantity of the metal remaining in the silicon film crystallized by metal-induced crystallization should be optimized to be applied to the current semiconductor device fabrication.

SUMMARY OF THE INVENTION

Accordingly, the present invention is directed to a polycrystalline silicon film containing Ni that substantially obviates one or more of the problems due to limitations and disadvantages of the related art.

An object of the present invention is to provide a polycrystalline silicon film which contains metal species in an appropriate quantity by minimizing the metal contamination fatal to the polysilicon formed by metal-induced crystallization for use in the fabrication of semiconductor devices.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the present invention includes a polycrystalline silicon film wherein the polycrystalline film contains Ni atoms having a density in the range of $2 \times 10^{17}$ to $5 \times 10^{19}$ atoms/cm$^3$ on average and comprises a plurality of needle-shaped silicon crystallites.

In another aspect, the present invention includes a polycrystalline silicon film wherein the polycrystalline film contains Ni atoms having a density in the range of $2 \times 10^{17}$ to $5 \times 10^{19}$ atoms/cm$^3$ and comprises a plurality of needle-shaped silicon crystallites and is formed on an insulating substrate.

In a further aspect, the present invention includes a polycrystalline silicon film wherein the polycrystalline film contains metal having a density in the range of $2 \times 10^{17}$ to $5 \times 10^{19}$ atoms/cm$^3$ and comprises a plurality of needle-shaped silicon crystallites and wherein the metal is a catalyst for metal induced crystallization of silicon.

In a further aspect, the present invention includes a polycrystalline silicon film wherein the polycrystalline film contains metal having a density in the range of $2 \times 10^{17}$ to $5 \times 10^{19}$ atoms/cm$^3$ and the polycrystalline silicon film comprises a plurality of needle-shaped silicon crystallites and wherein the metal is a catalyst for metal induced crystallization of amorphous silicon.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention, illustrate embodiments of the invention and together with the description serve to explain the principle of the invention.

DETAILED DESCRIPTION OF PREFERRED EMBODIMENTS

Figure 1:
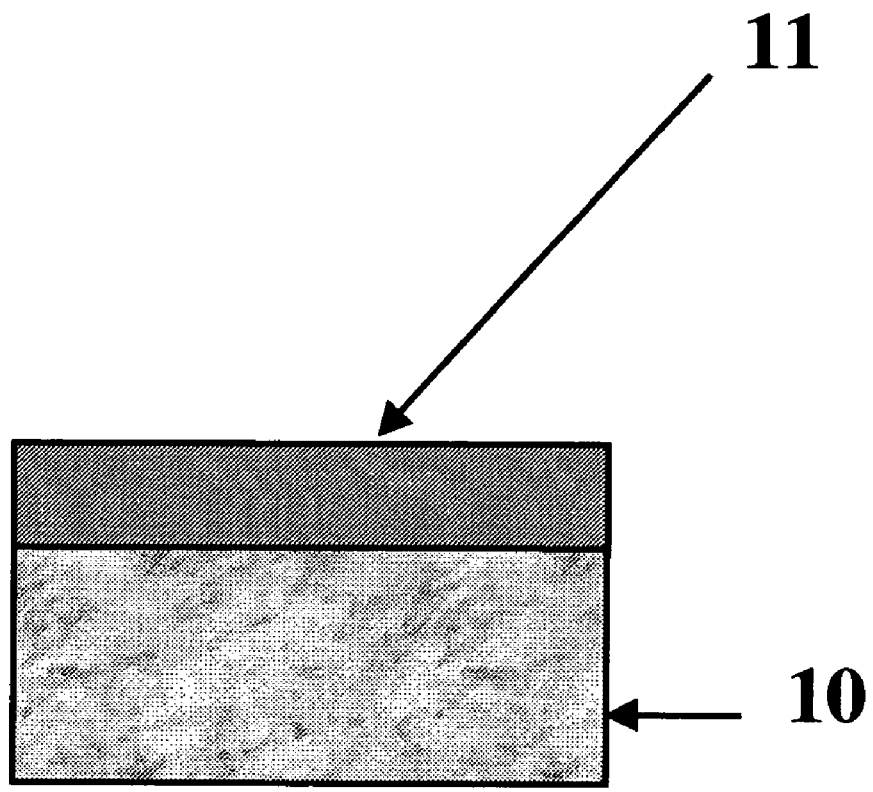
FIG. 1 shows a cross-sectional view of a polysilicon film according to a first embodiment of the present invention.

Reference will now be made in detail to the preferred embodiments of the present invention, examples of which are illustrated in the accompanying drawings.

In general, the metal induced crystallization is affected by time and temperature of annealing as well as quantity of metal in which crystallization time is reduced in general when the quantity of metal increases. In this case, annealing time is dramatically shortened and annealing temperature is greatly reduced in metal induced crystallization provided that electric field is applied to the amorphous silicon film containing the metal (Jin Jang, et al., Nature, Vol. 395, pp. 481-483 (1998)).

The polysilicon film of the present invention is distinguished by the fact that the film is fabricated by metal induced crystallization using Ni and Ni atoms exist in the film in an extremely small amount between $2 \times 10^{17}$ to $5 \times 10^{19}$ atoms/cm$^3$.

The polysilicon film of the present invention is formed by metal induced crystallization including the steps of adding a small quantity of Ni to an amorphous silicon film and carrying out rapid thermal process or another thermal treatment while electric field is applied thereon.

Ni is a catalyst for crystallizing a silicon film. Other various metal species such as Au or Co acting as a catalyst for metal induced crystallization can also be used for the crystallization.

At this time, the description of how Ni is used as a catalyst for metal induced crystallization is presented.

The steps of forming a polysilicon film are explained in the following description of the present invention.

An amorphous silicon film is deposited on an insulating layer. Then, the amorphous silicon film is put into a rapid thermal annealing system. A small amount of Ni is deposited on a substrate by sputtering and, successively, thermal treatment is carried out while applying an electric field thereon. In this case, the temperature of the thermal treatment ranges from 400 to 500° C.

Power needed for depositing Ni ranges from 1 to 100 W, which controls the deposition rate. The deposition rate is defined as an average amount presumed from deposition area, Ni density and deposition time after the total number of Ni atoms in the crystallized polysilicon film has been calculated by SIMS (secondary ion mass spectroscopy). Such method of metal deposition is simple and important in controlling the amount of metal existing in the film. In this case, the size of the sample is 100×100 mm$^2$ and a DC bias applied during the thermal treatment ranges from 0 to 1000 V.

Initial vacuum level for Ni deposition is under $10^{-6}$ Torr and a lamp is arranged in a heating block to heat the sample uniformity. An amorphous silicon film is heated by a ray or heat transferred through a substrate. Metal electrodes are contacted coplanar with both ends of the sample in order to apply uniform electric field to both ends of the amorphous silicon. In this case, the metal for the electrodes is made of MoW or Cr and the contact resistance is 6Ω at room temperature.

FIG. 1 shows a cross-sectional view of a polysilicon film according to a first embodiment of the present invention.

Referring to FIG. 1, a polysilicon film 11 which is formed by the above-mentioned method and which contains a small amount of Ni is on an insulating substrate 10 such as a glass substrate.

Figure 2:
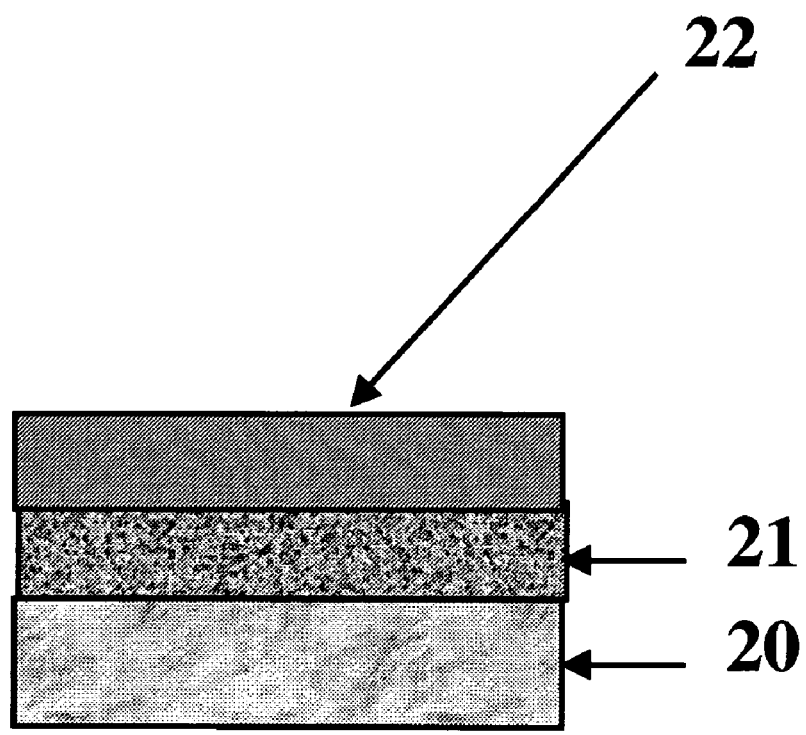
FIG. 2 shows a cross-sectional view of a polysilicon film according to a second embodiment of the present invention.

FIG. 2 shows a cross-sectional view of a polysilicon film according to a second embodiment of the present invention.

Referring to FIG. 2, an insulating layer 21 used as a buffer layer is formed on an insulating substrate 20 such as a glass substrate. A polysilicon film 22 which is formed by the above-mentioned method and which contains a small amount of Ni is on an insulating layer 21.

Figure 3:
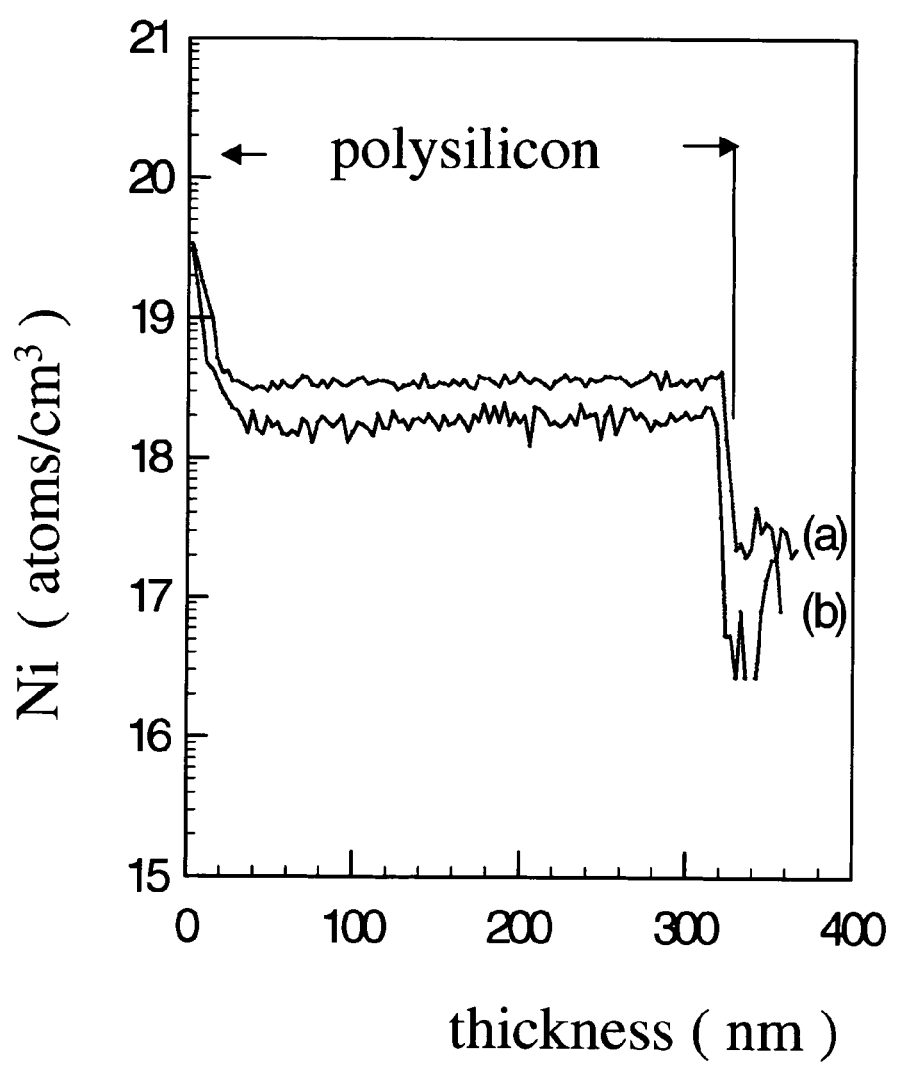
FIG. 3 shows a first example of the secondary ion mass-spectroscopy of a polysilicon film according to the first embodiment of the present invention.

FIG. 3 shows a first example of the secondary ion mass-spectroscopy of a polysilicon film formed by the first embodiment of the present invention.

Referring to FIG. 3, Ni atoms exist in the polysilicon film in an amount between $4 \times 10^{18}$/cm$^3$ (denoted by line (a)) and $2 \times 10^{18}$/cm$^3$ (denoted by line (b)) on average.

Figure 4:
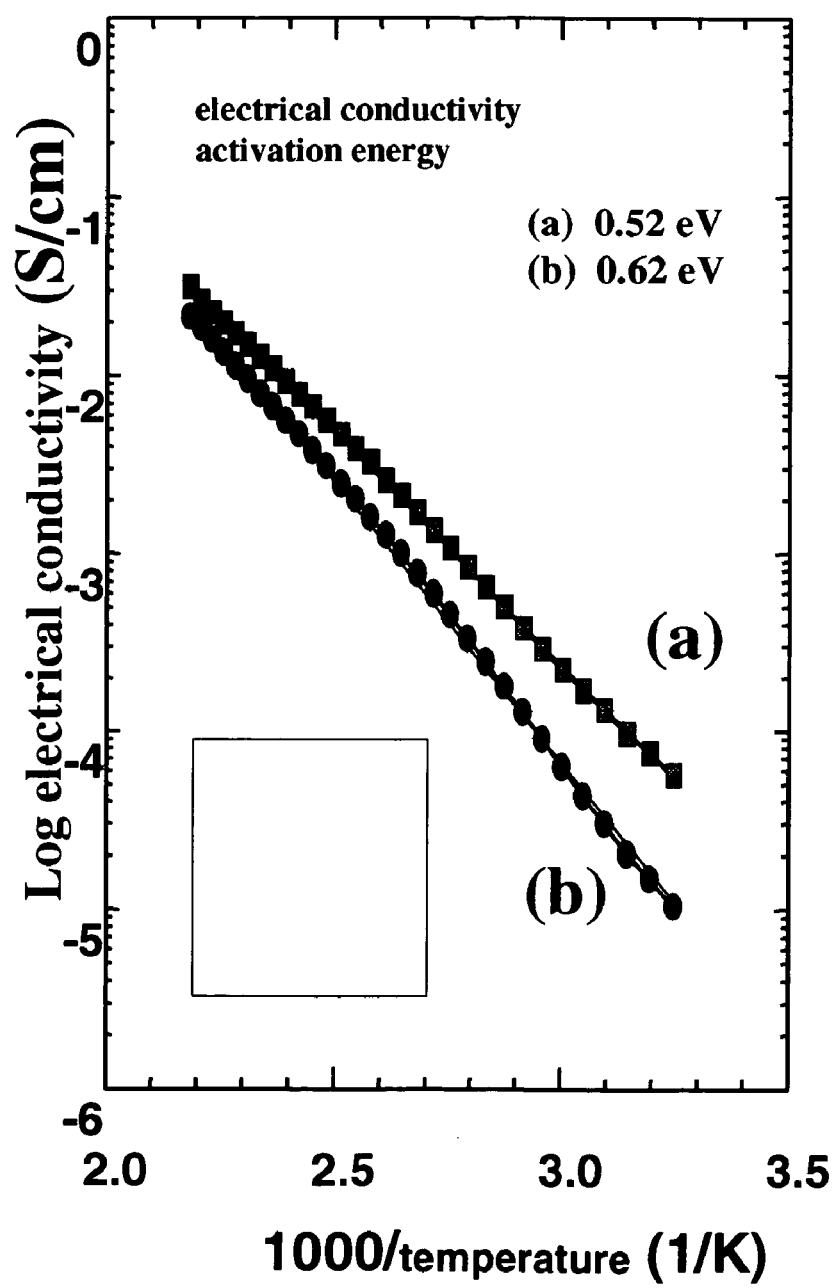
FIG. 4 shows electrical characteristics of the polysilicon film containing Ni suggested in FIG. 3.

FIG. 4 shows electrical conductivity of the polysilicon film containing Ni suggested in FIG. 3.

Referring to FIG. 4, each electrical conductivity activation energy of a polysilicon film containing Ni is 0.52 eV (denoted by line (a)) and 0.62 eV (line (b)), respectively. The graph shows the same activated from a conventional polysilicon film.

Figure 5:
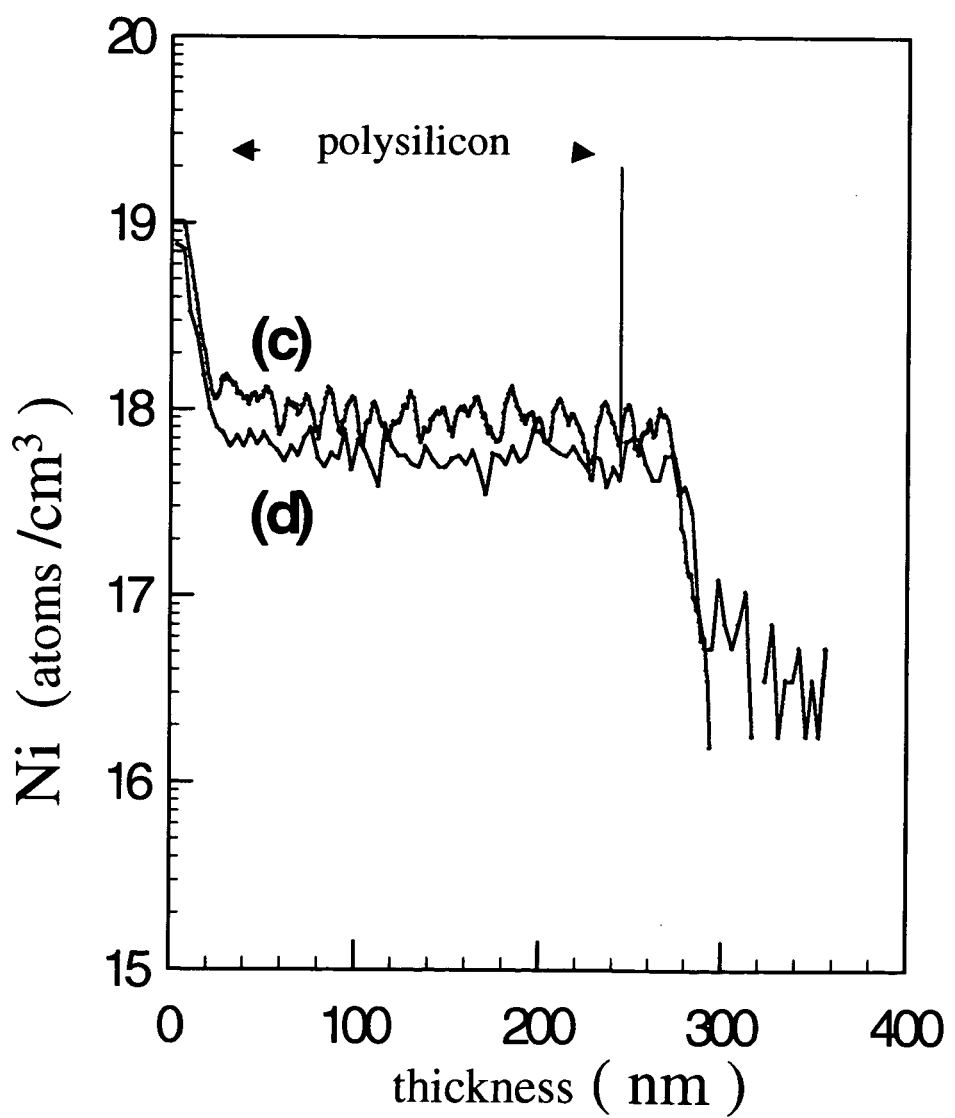
FIG. 5 shows a second example of the secondary ion mass-spectroscopy of a polysilicon film according to the second embodiment of the present invention.

FIG. 5 shows a second example of the secondary ion mass-spectroscopy of a polysilicon film formed by the second embodiment of the present invention.

Referring to FIG. 5, Ni atoms exist in the polysilicon film in an amount between $9 \times 10^{17}$/cm$^3$ (denoted by line (c)) and $6 \times 10^{17}$/cm$^3$ (denoted by line (d)) on average.

Figure 6:
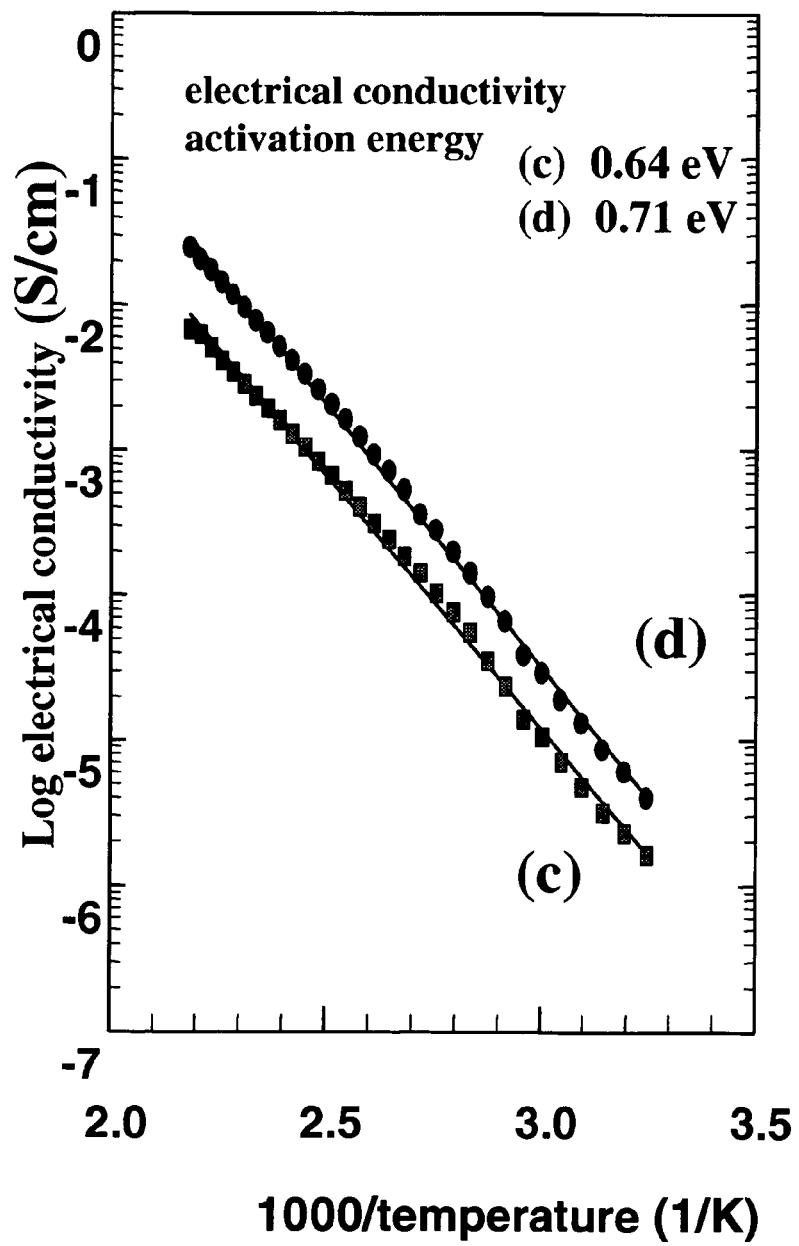
FIG. 6 shows electrical characteristics of the polysilicon film containing Ni suggested in FIG. 5.

FIG. 6 shows electrical characteristics of the polysilicon film containing Ni suggested in FIG. 5.

Referring to FIG. 6, each electrical conductivity activation energy of a polysilicon film containing Ni is 0.64 eV (denoted by line (c)) and 0.71 eV (line (d)), respectively.

Figure 7:
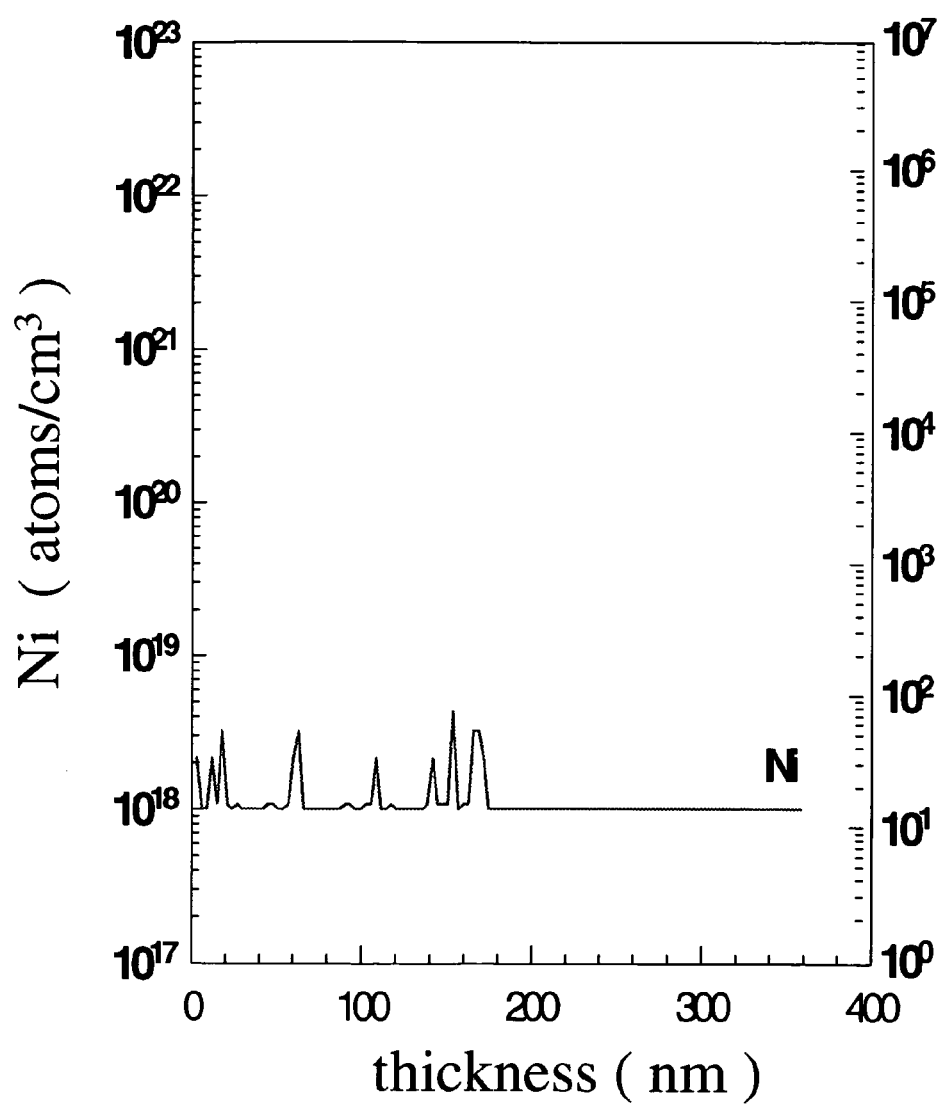
FIG. 7 shows a third example of the secondary ion mass-spectroscopy of a polysilicon film according to the third embodiment of the present invention.

FIG. 7 shows a third example of the secondary ion mass-spectroscopy of a polysilicon film formed by the third embodiment of the present invention.

Referring to FIG. 7, Ni atoms exist in the polysilicon film in an amount of about $1 \times 10^{18}$/cm$^3$ on average.

Figure 8:
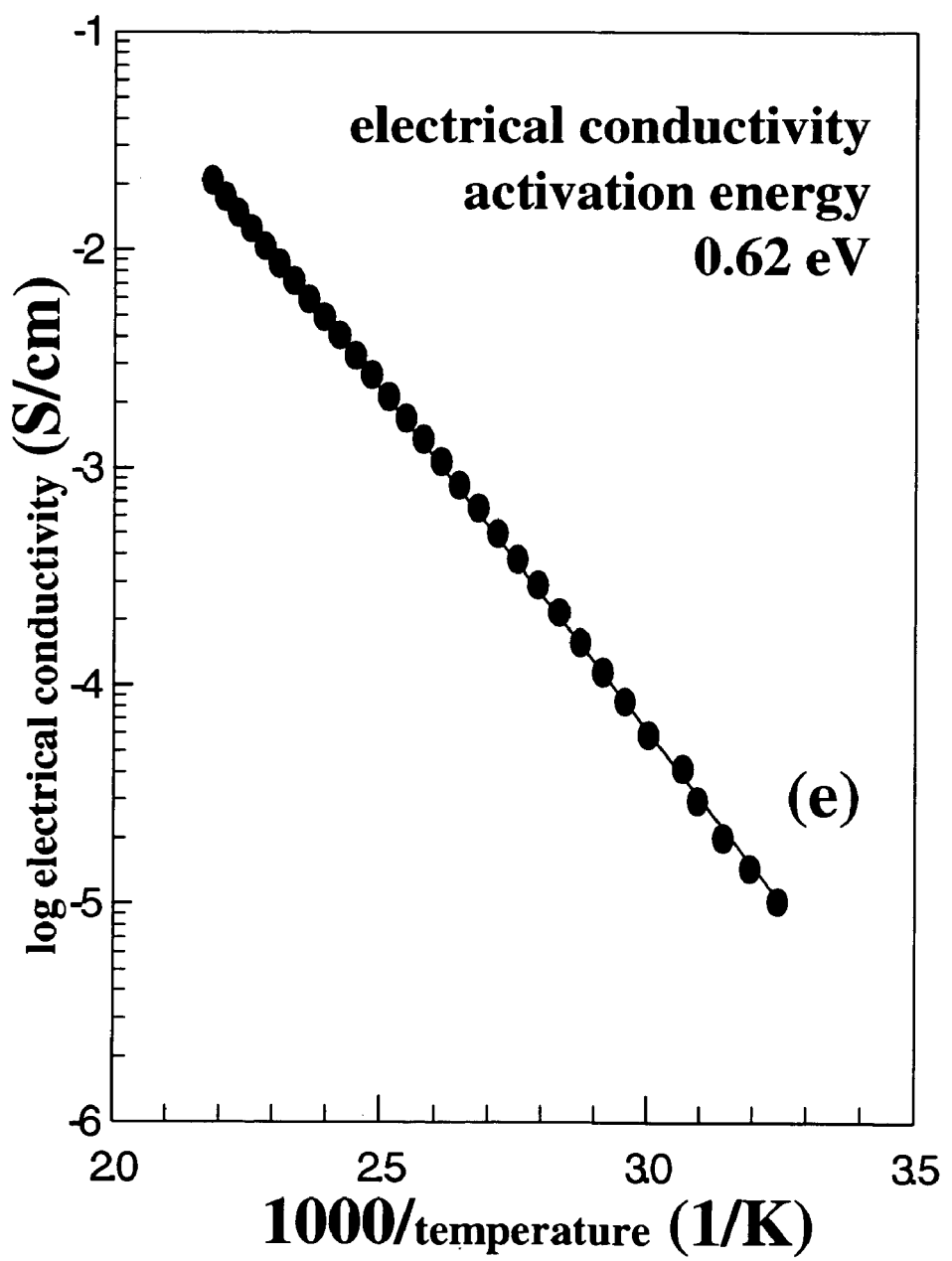
FIG. 8 shows electrical characteristics of the polysilicon film containing Ni suggested in FIG. 7.

FIG. 8 shows electrical conductivity of the polysilicon film containing Ni suggested in FIG. 7.

Referring to FIG. 8, each electrical conductivity activation energy of a polysilicon film containing Ni is 0.62 eV.

Figure 9:
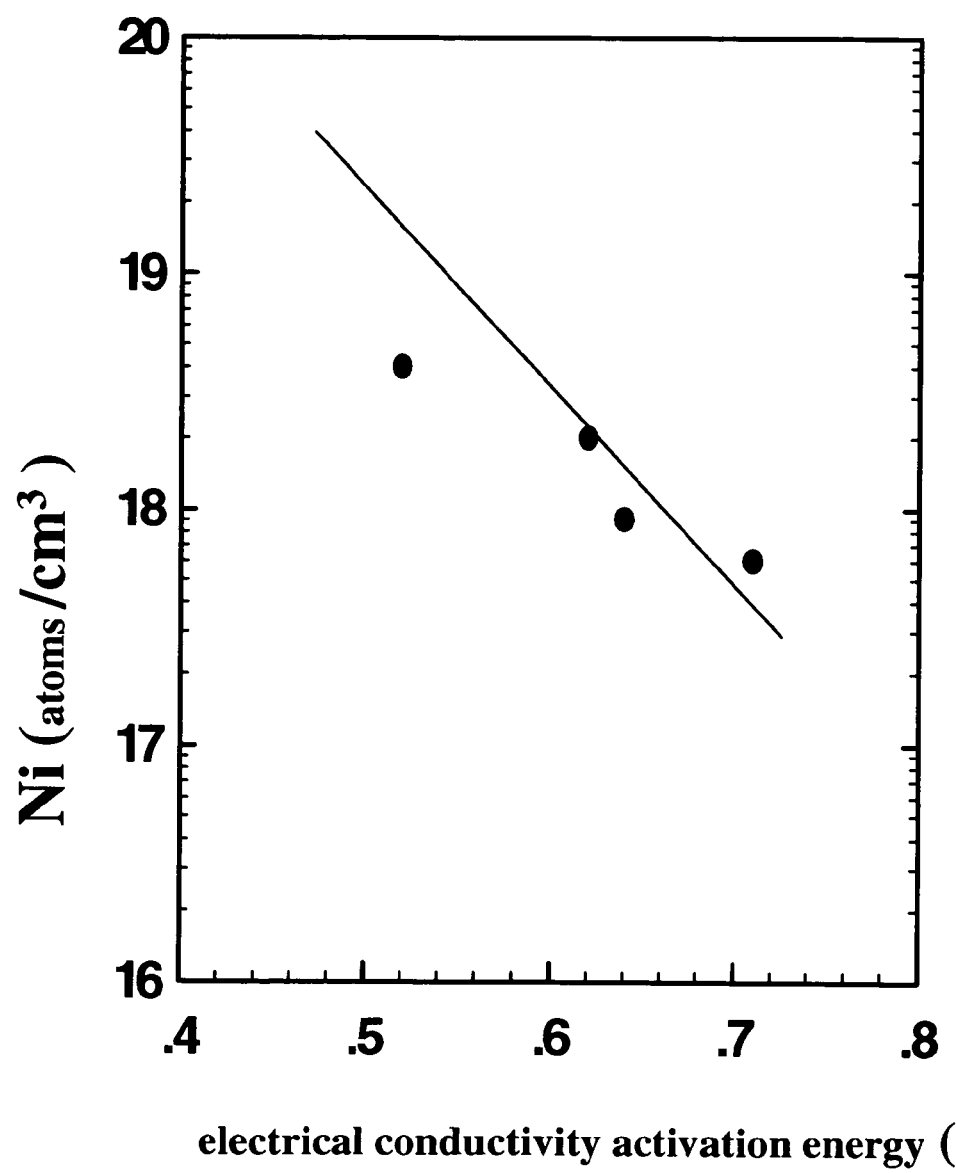
FIG. 9 shows a graph of an electrical conductivity activation energy vs. number of Ni atoms contained in the polysilicon film according to the present invention.

FIG. 9 shows a graph of an electrical conductivity activation energy vs. number of Ni atoms contained in the polysilicon film according to the present invention.

Referring to FIG. 9, the graph shows electrical conductivity activation energy when Ni atoms exist in the polysilicon film in an amount between $10^{17}/cm^3$ and $10^{19}/cm^3$ on average.

As the quantity of Ni increases in the film, so do acceptors within a silicon band gap. Thus, electrical conductivity activation energy decreases. Referring to the drawing, as most of Ni atoms do not form acceptors in the polysilicon film, such silicon material can be used for semiconductor device fabrication provided that the number of Ni atoms in the film is under $2\times10^{19}/cm^3$ on average.

Figure 10:
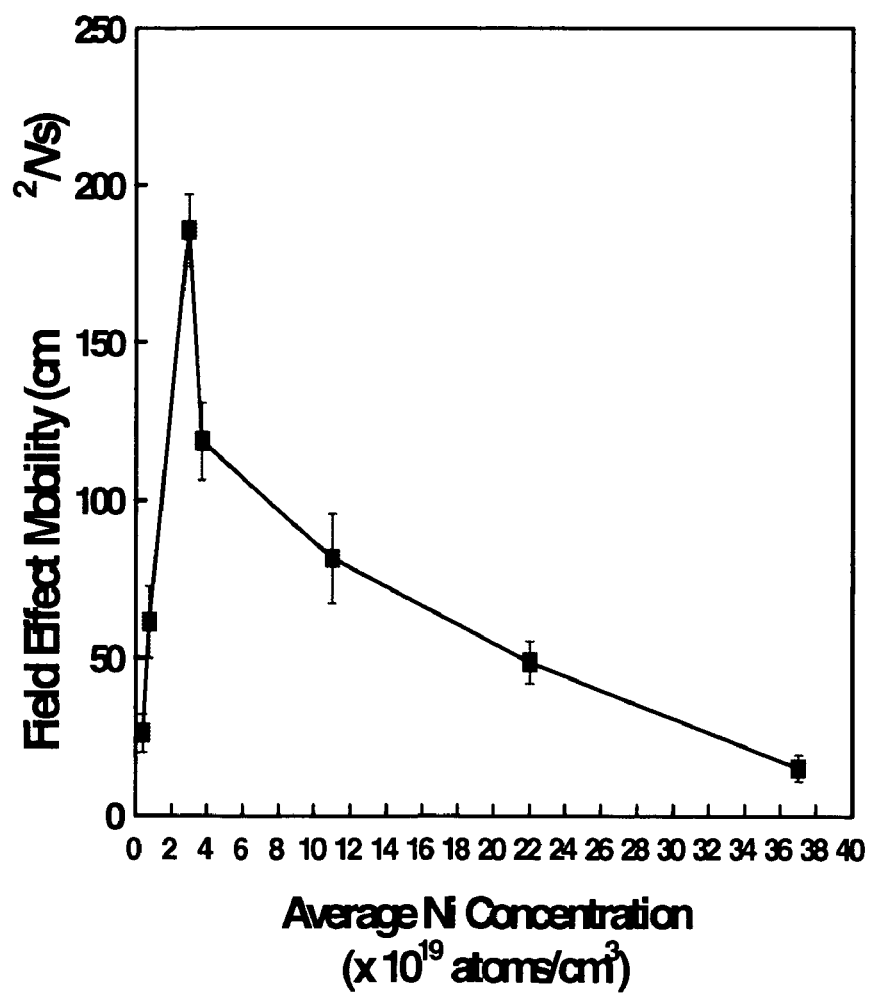
FIG. 10 shows field effect mobility of a TFT fabricated using the polysilicon film according to another embodiment of the present invention in accordance with the Ni containment.

FIG. 10 shows field effect mobility of a TFT fabricated using the polysilicon film according to another embodiment of the present invention in accordance with the Ni containment.

Referring to FIG. 10, crystallization is achieved within 10 minutes by applying an electric field during crystallization at a temperature of about 500° C.

The maximum value of mobility is achieved when the amount of Ni is $2.96\times10^{19}/cm^3$.

Mobility decreases greatly when the amount of Ni is over $10^{20}/cm^3$.

It is impossible to achieve crystallization experimentally within 10 minutes unless the amount of Ni is under $1\times10^{18}/cm^3$.

FIGS. 11A to 11D show TEM pictures and diffraction patterns of a polysilicon film according to the Ni containment.

Figure 11A:
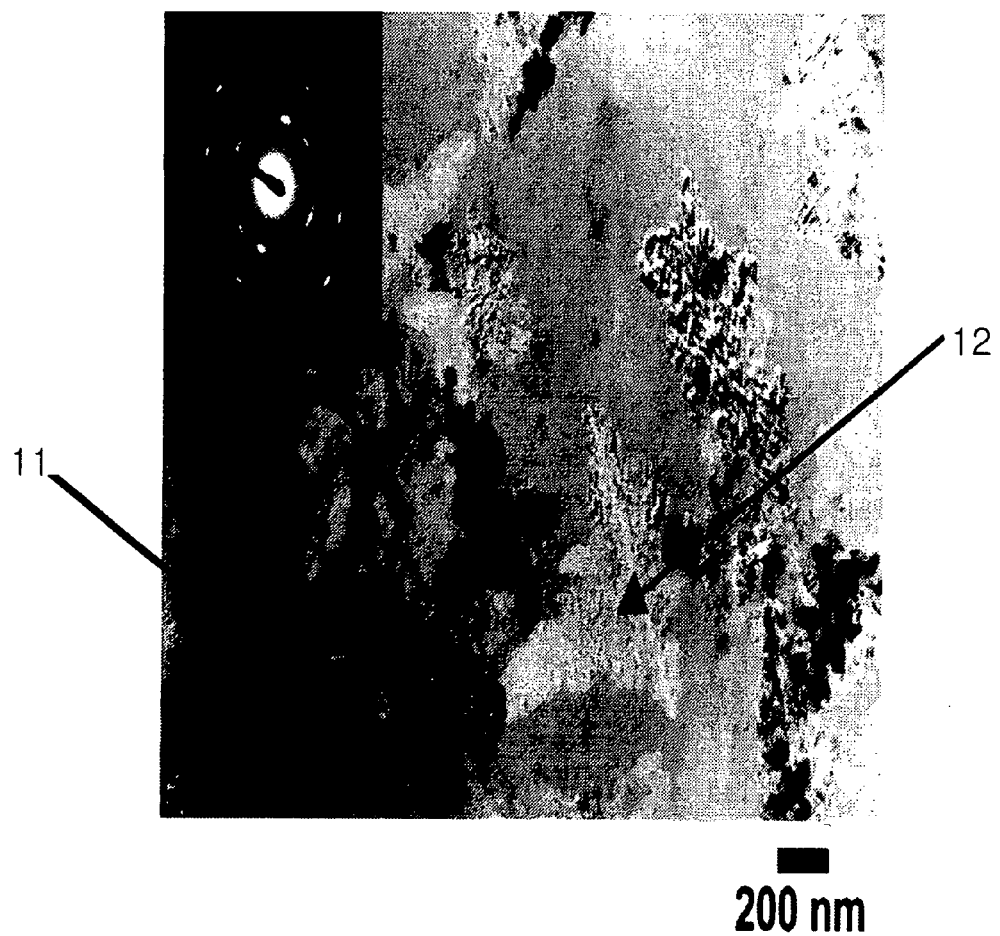
FIGS. 11A to 11D show TEM pictures and diffraction patterns of a polysilicon film according to the Ni containment.

FIG. 11A shows a TEM picture and diffraction patterns of a polysilicon film containing Ni atoms of $1.6\times10^{17}$ atoms/$cm^3$ on average.

Referring to FIG. 11A, crystallites 12 of a leaf-like shape are verified in an amorphous silicon region 11, showing that crystallization is achieved locally instead of total crystallization of the film.

Figure 11B:
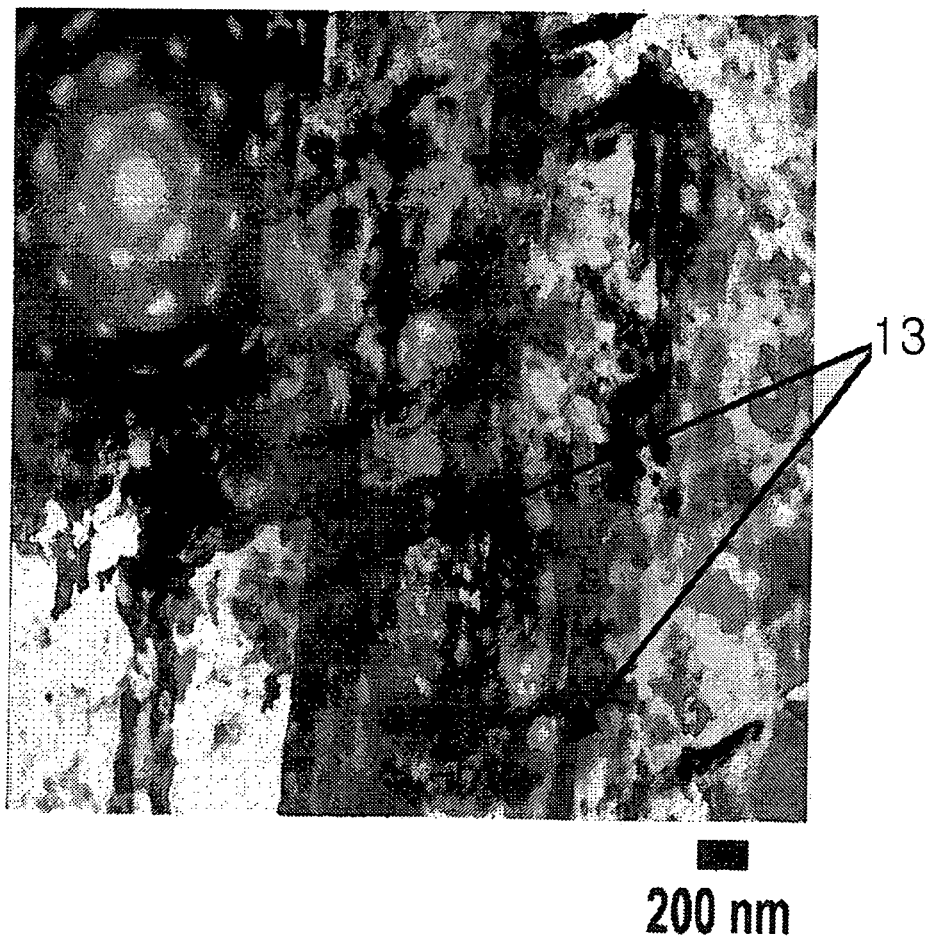

FIG. 11B shows a TEM picture and diffraction patterns of a polysilicon film containing Ni atoms of $4.8\times10^{17}$ atoms/$cm^3$ on average.

Referring to FIG. 11B, crystallites 13 having a needle shape are verified, and the whole amorphous silicon is crystallized uniformly.

Figure 11C:
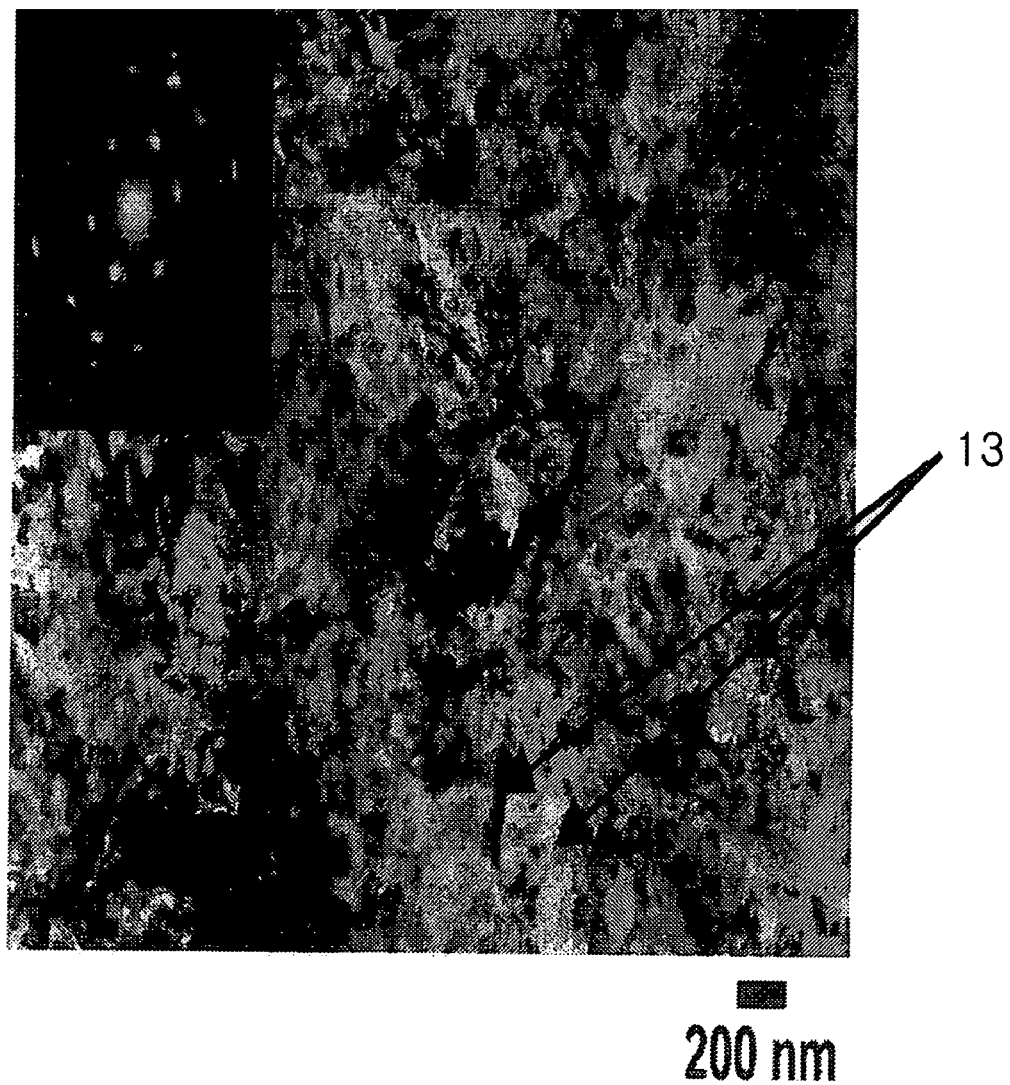

FIG. 11C shows a TEM picture and diffraction patterns of a polysilicon film containing Ni atoms of $1.6\times10^{19}$ atoms/$cm^3$ on average.

Referring to FIG. 11C, it is noted that the film is crystallized by crystallites 13 of a needle shape, and the whole amorphous silicon is crystallized uniformly.

Figure 11D:
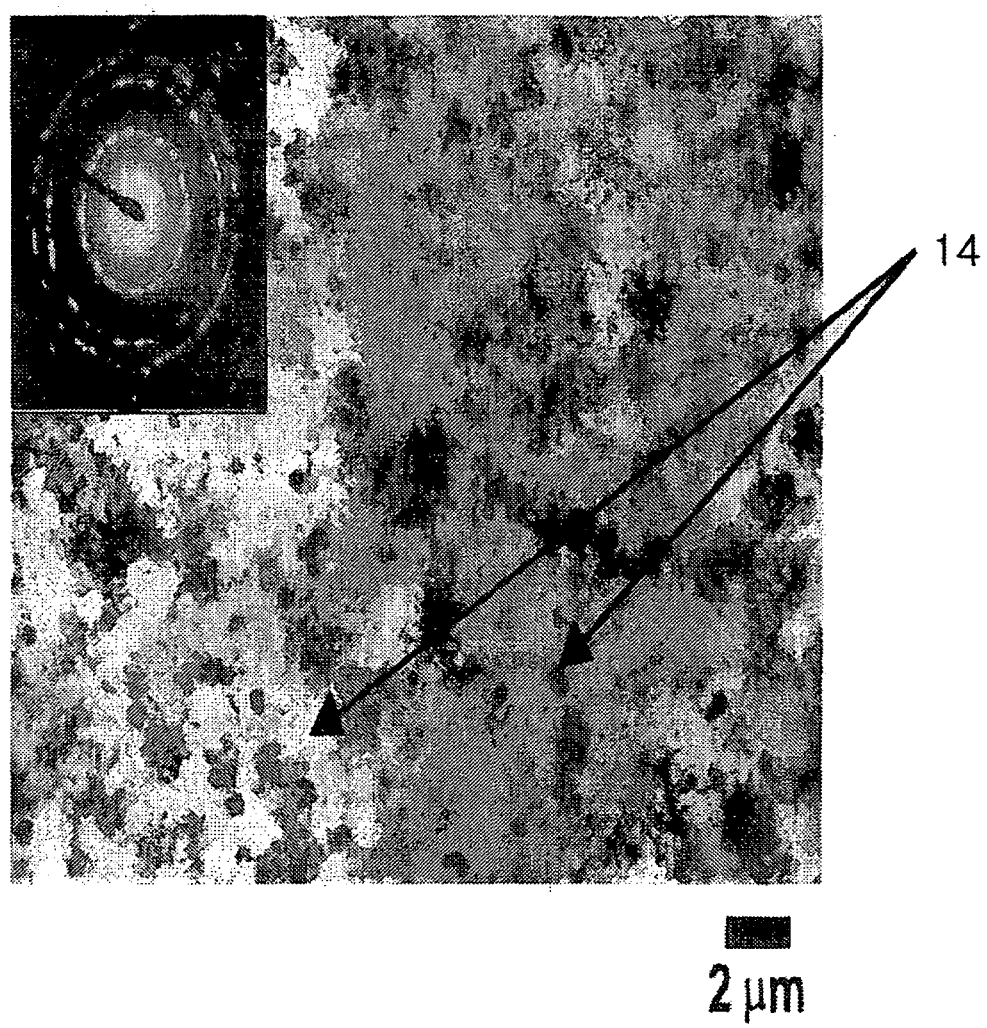

FIG. 11D shows a SEM picture and diffraction patterns of a polysilicon film containing Ni atoms of $3\times10^{20}$ atoms/$cm^3$ on average.

Referring to FIG. 11D, needle shaped crystallites are not identified in the drawing, and the whole film is filled with crystallites 14 of a small circle-like shape. Such polysilicon fails to be used for fabricating solar cells, thin film transistors, and the like.

Figure 12A:
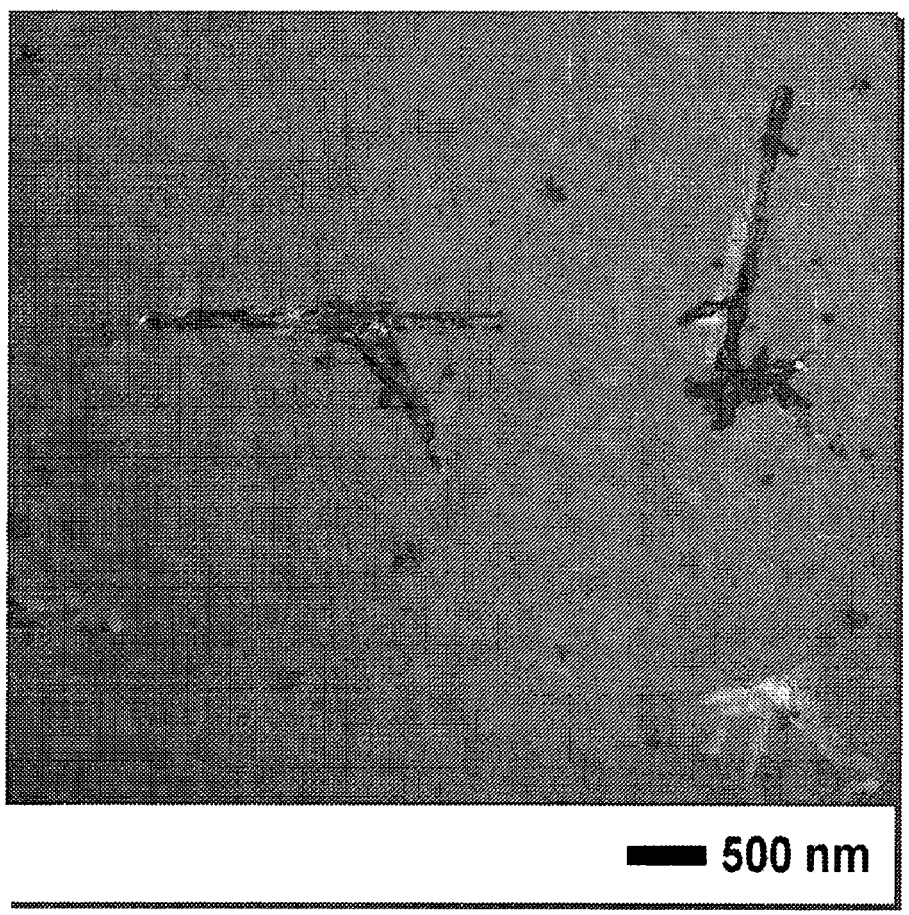
FIGS. 12A to 12C show the crystallization of a polysilicon film according to the present invention.
Figure 12B:
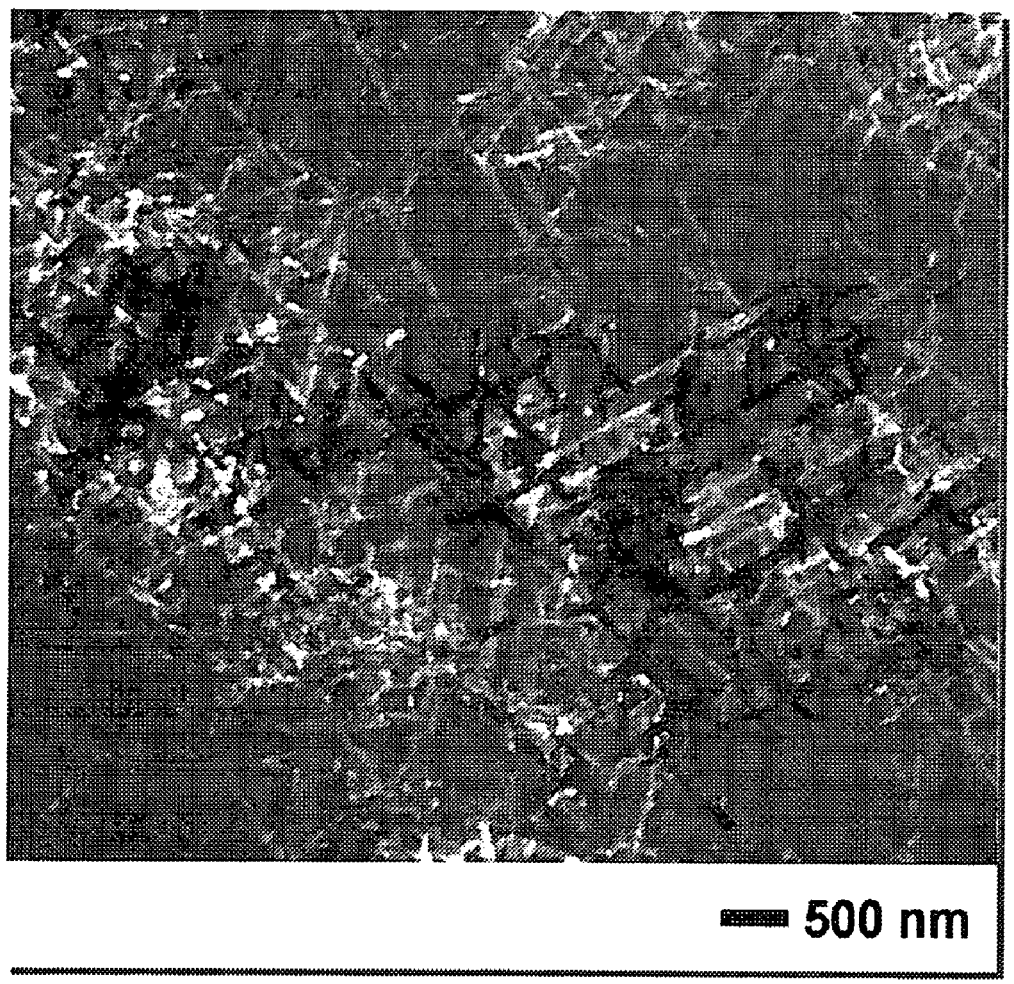
Figure 12C:
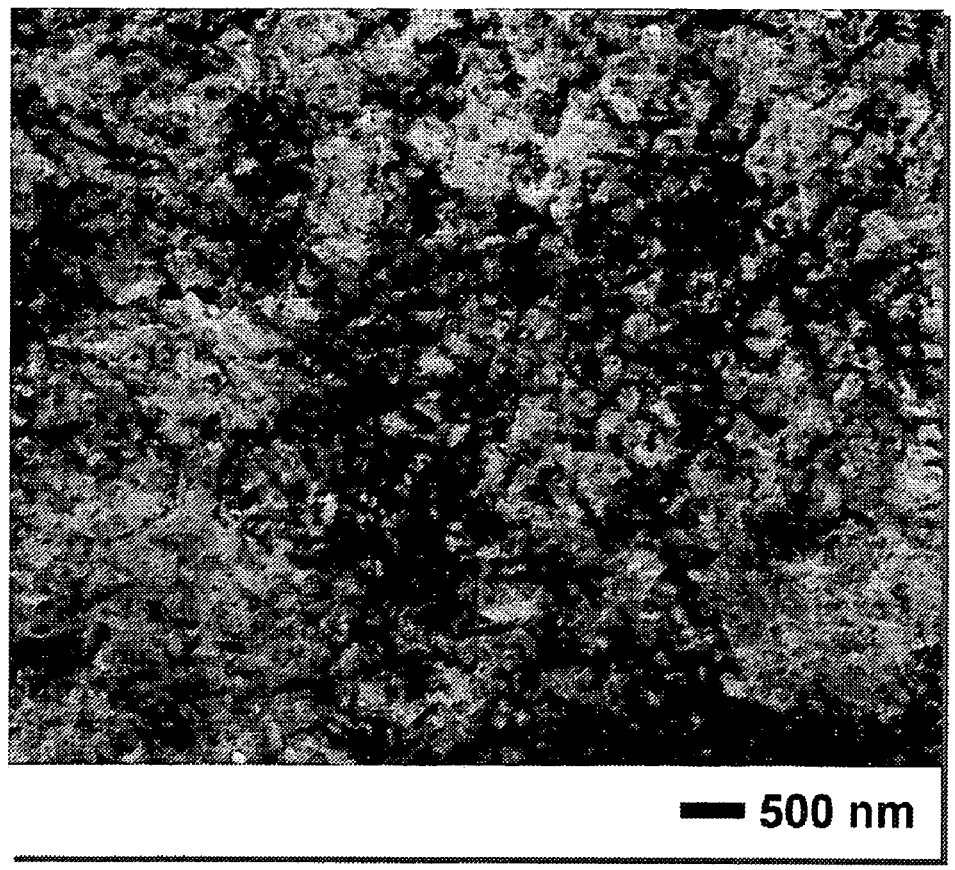

FIGS. 12A to 12C show the crystallization of a polysilicon film according to the present invention.

Referring to FIG. 12A, each crystallite having a needle shape grows from a nucleus for crystallization in a certain direction by the movement of $NiSi_2$ in the early stage of crystallization, respectively.

Referring to FIG. 12B, this crystallite having a needle shape grows continuously until this crystallite collides with other crystallites grown from other nucleuses and stops its growth.

Referring to FIG. 12C, an amorphous silicon thin film is crystallized by a number of crystallites having a needle shape.

As mentioned in the above description of the present invention, a polysilicon film containing Ni having a density in the range of $2\times10^{17}$ and $5\times10^{19}$ atoms/$cm^3$ consists of needle shaped silicon crystallites, and the whole part of the polysilicon film is crystallized uniformly.

Such a polysilicon film according to the present invention avoids metal contamination usually generated in a conventional method of metal induced crystallization.

Accordingly, the polysilicon film of the present invention is applied to the fabrication of a TFT-LCD, a solar cell, etc. instead of polysilicon crystallized by the current laser crystallization.

It will be apparent to those skilled in the art that various modifications and variations can be made in polycrystalline silicon containing Ni of the present invention without departing from the spirit or scope of the invention. Thus, it is intended that the present invention cover the modifications and variations of this invention provided they come within the scope of the appended claims and equivalents.

What is claimed is:

1. A polycrystalline silicon film on a buffer layer that is on a substrate, the polycrystalline film containing nickel metal of which density ranges $2\times10^{17}$ to $5\times10^{19}$ atoms/cm3, and an electrical conductivity activation energy between 0.53 eV and 0.71 eV, the polycrystalline silicon film comprising a plurality of needle-shaped silicon crystallites;
   metal electrodes on opposite sides of the polycrystalline silicon film; and
   an electric field substantially across the polycrystalline silicon between the metal electrodes,
   wherein the polycrystalline silicon film is formed by crystallizing an amorphous silicon film containing nickel metal by a thermal treatment carried in a temperature of 400 to 500° C. and due to the electric field, and
   wherein the needle-shaped silicon crystallites are formed by movement of a silicide of the metal.

2. The polycrystalline silicon film according to claim 1, wherein the polycrystalline film includes one of gold(Au) and cobalt(Co) instead of nickel metal.

3. The polycrystalline silicon film according to claim 1, wherein the nickel metal works as a catalyst during the crystallization.

4. A polycrystalline silicon film on a buffer layer that is on a substrate, the polycrystalline film containing nickel metal of which density ranges $2\times10^{17}$ to $5\times10^{19}$ atoms/cm3, and an electrical conductivity activation energy between 0.53 eV and 0.71 eV, the polycrystalline silicon film comprising a plurality of needle-shaped silicon crystallites;
   metal electrodes on opposite sides of the polycrystalline silicon film;
   an electric field substantially across the polycrystalline silicon between the metal electrodes; and
   a heating element that heats the polycrystalline silicon film,
   wherein the polycrystalline silicon film is formed by crystallizing an amorphous silicon film containing nickel metal by heating the polycrystalline film to a temperature of 400 to 500° C. and due to the electric field, and
   wherein the needle-shaped silicon crystallites are formed by movement of a silicide of the metal.

* * * * *